May 6, 1958 L. D. ARMSTRONG ET AL 2,833,678

METHODS OF SURFACE ALLOYING WITH ALUMINUM-CONTAINING SOLDER

Filed Sept. 27, 1955

INVENTORS:
LORNE D. ARMSTRONG
& MICHAEL J. BENTIVEGNA
BY J. C. Whittaker
ATTORNEY United States Patent Office 2,833,678
Patented May 6, 1958

2,833,678

METHODS OF SURFACE ALLOYING WITH ALUMINUM-CONTAINING SOLDER

Lorne D. Armstrong and Michael J. Bentivegna, Princeton, N. J., assignors to Radio Corporation of America, a corporation of Delaware Application September 27, 1955, Serial No. 537,006

13 Claims. (Cl. 148—1.5)

This invention relates to semiconductive devices of the alloy junction type and to improved methods of manufacturing such devices. More particularly, the invention relates to improved methods of surface alloying aluminum-containing electrodes to semiconductive germanium and silicon bodies.

The practice of the instant invention is particularly advantageous in the manufacture of alloy junction transistor devices. A typical device of this class comprises a relatively thin wafer of semiconductive germanium or silicon having two rectifying electrodes surface alloyed in coaxial alignment upon opposite faces thereof. One of the electrodes is commonly utilized in a circuit as an emitter electrode to inject minority electric charge carriers into the wafer. The other, opposite electrode is then utilized as a collector electrode to withdraw minority charge carriers from the wafer. A non-rectifying or ohmic connection is also made to the wafer. This connection is called the base connection or simply the base contact and provides a common point of reference potential between an input circuit and an output circuit which may be coupled between the emitter and collector electrodes respectively and the base. The base wafer of semiconductive material in such a device may be of either n-type or of p-type conductivity. Commonly there is associated with each of the rectifying electrodes a region within the wafer having the opposite type of conductivity from the bulk of the wafer. In some devices, however, the region associated with the rectifying electrode is of the same type of conductivity as the bulk of the wafer but differs from the bulk in its conductivity value, generally being of greater conductivity than the bulk. Thus, a transistor device may comprise a semiconductive wafer having different conductivity regions in any of several sequences such as n-p-n, p-n-p, $p^+$-p-n, $n^+$-n-p and etc. The invention is also useful in making such devices as semiconductor diodes, tetrodes and unipolar transistors and, in fact, is generally applicable to all semiconductor devices comprising rectifying electrodes having p-type conductivity regions associated with them.

Relatively pure indium is at present the material most commonly used to make surface alloyed electrodes having p-type conductivity regions associated with them in semiconductive germanium or silicon. It has been previously established that certain characteristics of such electrodes, as explained in greater detail hereinafter, may be improved if the electrodes are made of aluminum or of an alloy of indium with about 2% to 10% of aluminum. This discovery, however, has not heretofore been exploited commercially to any appreciable extent, primarily because of the difficulty of alloying aluminum or aluminum-containing alloys. As is well known, aluminum is a highly reactive material and almost always bears a refractory surface film or coating of oxidic nature. It is relatively difficult to remove these refractory surface films from aluminum and also from alloys containing even relatively small proportions of aluminum. Even minute quantities of such films on the surfaces of electrode pellets have been found to impede the surface alloying process and to produce non-uniform and often unpredictable results.

Accordingly, one object of the instant invention is to provide improved methods of surface alloying aluminum-containing electrodes upon semiconductor surfaces, a further object being thereby to provide improved semiconductor devices.

According to the invention, it has now been found that the advantageous effects of aluminum in surface alloyed electrodes may be achieved by including only very small proportions of aluminum in an indium electrode pellet. If the proportion of aluminum in the pellet is restricted to about 0.1% to 0.2%, the principal benefits of the aluminum are substantially retained while, at the same time, the previously encountered difficulties of surface alloying are significantly reduced. Still further improvement has been achieved by the inclusion of slightly larger quantities of aluminum in the indium pellet with the addition of copper, gold or silver. Copper, gold and silver act as wetting agents and appear effectively to overcome the reluctance of aluminum in surface alloying. The copper, gold or silver may be included in the pellets in any desired proportion up to about 10%. Especially favorable results are achieved by the use of a composite pellet comprising a core of an aluminum-indium alloy and an outer surface of pure indium or an indium alloy free of aluminum. In this way the wetting of the semiconductor is accomplished by an aluminum-free alloy and the aluminum is subsequently introduced into the wetted surface.

The invention will be described in greater detail in connection with the accompanying drawing in which.

Similar reference characters are applied to similar elements throughout the drawing.

Figure 1:
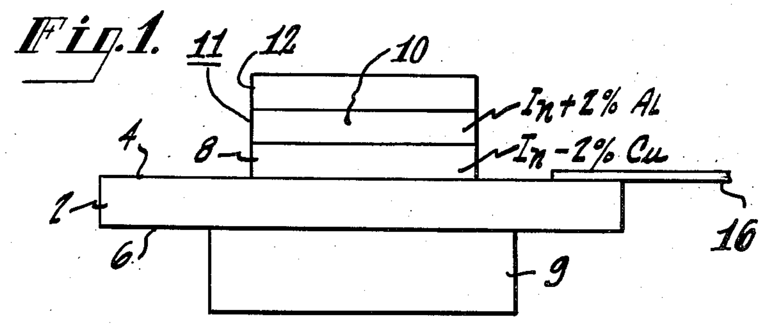
Figure 1 is a schematic, elevational view of a semiconductor wafer and laminar electrode pellet assembly preparatory to a surface alloying process.

Figure 1 illustrates an assembly preparatory to a surface alloying process according to a preferred embodiment of the instant invention. A semiconductor wafer 2 of n-type germanium is first prepared according to conventional techniques. It may be initially cut from a relatively large single crystal of n-type semiconductive germanium having a resistivity of about 3 ohm-cm. As initially cut and ground it may be, for example, about .085" x 0.1" x .01" thick. It is etched in a mixture of nitric and hydrofluoric acids to reduce its thickness to about .005" and to expose a clean, crystallographically undisturbed surface. A tri-laminar, disc-shaped electrode pellet 11 about .025" in diameter and .01" thick is placed upon one surface 4 of the wafer.

The composition and arrangement of the laminations of the pellet are critical in the practice of the instant invention. The pellet consists of three layers, 8, 10 and 12 respectively, indium being the major constituent of all three. The layer 8 in contact with the germanium is substantially free of aluminum. It may be of relatively pure indium but preferably includes about 0.2% to 1% copper. The intermediate layer 10 includes about 2% of aluminum. The third layer 12 is of the same composition as the first layer 8. The pellet may be prepared by first rolling together three layers of foil of the respective compositions to compress them and to form a unitary, bonded, laminar foil. The pellet 11 may be punched or otherwise cut from the compressed, laminar foil.

Functionally, the pellet need comprise only the first two layers 8 and 10, the third layer 12 being included for convenience in orienting the pellets upon the wafer. It is essential in the practice of the invention according to the instant embodiment that an aluminum-free layer of the pellet contact the semiconductor. With a tri-laminar wafer this is readily accomplished but when one of the aluminum-free layers is omitted an orientation problem arises because then each pellet must be placed right side up on its wafer.

The assembly is supported in any suitable jig and a second pellet 9 is placed upon the opposite surface 6 of the wafer. This second pellet is preferably slightly larger in diameter than the first pellet 11. It may be, for example, .05" in diameter by .01" thick. It may be similar in composition to the first pellet or, alternatively, may be of relatively pure indium. (In the instant embodiment the second pellet is designed for use as a collector electrode and the inclusion of aluminum has little effect on its efficiency.) A solder coated base tab 16 is also placed on the surface 4 adjacent to the first electrode pellet.

Figure 2:
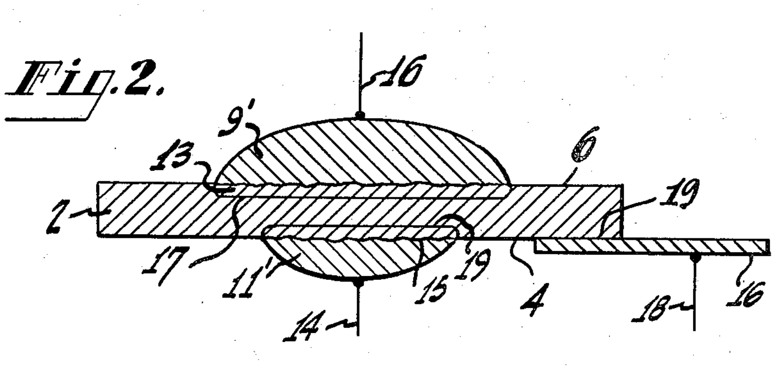
Figure 2 is a schematic, elevational, cross-sectional view of a semiconductor wafer having a surface alloyed electrode according to the invention; and, Figure 3 is a schematic, elevational view of a semiconductor body and electrode pellet assembly according to a second embodiment of the invention and preparatory to a surface alloying process.

The assembly is heated as in the conventional surface alloying process to about 525° C. in a non-oxidizing atmosphere such as dry hydrogen or helium for about five minutes to melt the electrode pellets and to surface alloy them into the wafer to form a device as shown in Figure 2. In the surface alloying process as the electrode pellet 11 melts the indium-copper alloy of the layer 8 wets the germanium surface uniformly and completely before sufficient aluminum can diffuse from the layer 10 to impede the wetting process. Once the wetting is accomplished, the presence of aluminum in the molten pellet does not adversely affect it.

The completed device, as shown in Figure 2, comprises the germanium base wafer 2, a pair of surface alloyed rectifying electrodes 9' and 11' and the base tab 16. The electrode 11' formed of the composite electrode pellet 11 now consists of a relatively uniform alloy of indium, copper, aluminum and germanium. During the alloy process the ingredients of the three layers of the pellet are thoroughly intermixed by diffusion and thermal agitation and a portion of the germanium wafer is dissolved in the molten pellet. Upon cooling, particularly if the cooling is accomplished at a relatively slow rate, most of the dissolved germanium recrystallizes upon the wafer to reconstitute the wafer substantially to its original dimensions and to form a recrystallized region 15 in the wafer. A relatively small proportion of the germanium, however, remains in the electrode alloy, usually in a separate phase. A p-n rectifying barrier 19 is formed in the wafer at the surface representing the maximum penetration of the molten pellet into the wafer during the process.

The advantageous effects achieved by the presence of the aluminum are believed to be due primarily to the relatively high solubility of aluminum in solid germanium. It is believed that relatively large proportions of aluminum are included in the recrystallized region 15 during the recrystallization process because of this high solubility. The presence of relatively large proportions of aluminum serves to lower the resistivity of the recrystallized region below values normally obtainable with indium electrodes and thus to improve the injection efficiency of the barrier 19.

The injection efficiency indicates the ability of the barrier to inject minority charge carriers into the bulk of the wafer. This characteristic affects the current gain characteristics of a transistor when the barrier is operated as an emitter and also limits the current handling capacity of the transistor.

The second electrode 9' consists essentially of an alloy of indium and germanium, usually as a two-phase system. The recrystallized region 13 associated with the second electrode 9' is formed in the same manner and is similar to the recrystallized region 15 associated with the first electrode except that it does not comprise aluminum and does not have as high an injection efficiency. The characteristics of the second electrode 9' as a collector electrode are not adversely affected by the presence of aluminum and if convenience so dictates, it may be made of the same materials as the first electrode. The base tab 16 is attached by a non-rectifying solder connection 19 to the base wafer 2. Electrical leads 14, 16 and 18 may be attached to the rectifying electrode and the base tab respectively, and the device may be conventionally etched, mounted and potted.

Figure 3:
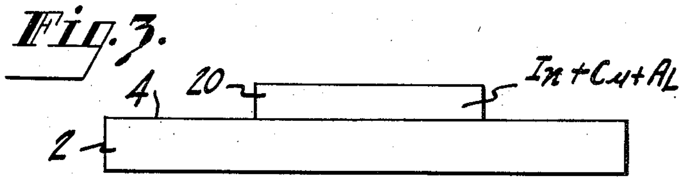

A similar device may be made according to a second, alternative embodiment of the invention as shown in Figure 3. To avoid unnecessary repetition, Figure 3 illustrates only an assembly preparatory to making a single surface alloyed electrode. It will be understood that the same process steps heretofore described may be utilized to make multi-electrode devices such as the transistor device shown in Figure 2. Figure 3 shows a germanium wafer 2 similar in size and nature to the wafer described in connection with Figures 1 and 2. An electrode pellet 20 is placed upon one surface 4 of the wafer. This pellet consists of an alloy of indium with 2% copper and up to 2%, but preferably about 1% aluminum, by weight. When fired as heretofore described, the pellet surface alloys upon the wafer to form a rectifying electrode having properties generally similar to those of the rectifying electrode 11' shown in Figure 2. The presence of copper in the electrode pellet substantially overcomes the adverse effects normally encountered when surface alloying aluminum-containing alloys.

The distinction in this alternative embodiment is that the aluminum is initially present in the electrode alloy at the interface between the pellet and the germanium, whereas in the preferred embodiment the surface of the electrode pellet initially in contact with the germanium wafer is substantially free of aluminum. Although devices made according to this embodiment are often fully comparable to devices made according to the preferred embodiment it is relatively more difficult to achieve consistently excellent results when an aluminum-bearing surface is initially contacted to the semiconductor. Indium-aluminum alloys appear to be relatively sensitive to minute quantities of oxygen, water or other reactive materials that may be present in the firing atmosphere. In the practice of this embodiment of the invention, therefore, great care should be taken to purify the atmosphere to remove especially all traces of oxygen and water vapor.

According to yet another embodiment of the invention not separately illustrated, the benefits of aluminum in a surface alloyed electrode are provided by surface alloying an electrode pellet consisting essentially of indium and about 0.1% to 0.2% aluminum. Principally because of the reduction in the proportion of aluminum the injection efficiency of such electrodes is not quite as high as the injection efficiency of the electrodes heretofore described in connection with the first two embodiments of the invention. It is, however, substantially higher than the injection efficiencies of previous electrodes made of pure indium. By maintaining the aluminum concentration below 0.5% and preferably at about 0.2% the previously described surface alloying difficulties are minimized while at the same time sufficient aluminum is made available significantly to decrease the resistivity of the recrystallized region. If substantially less than about 0.1% aluminum is included in the electrode, the beneficial effects of the aluminum are reduced and only very slight improvement is noted. In this case also, wherein no copper is included in the electrode pellet, the wetting of the wafer by the pellet in the alloy process is sometimes less uniform than in the first embodiment and purification of the firing atmosphere is relatively critical.

While the invention has been described in connection with surface alloying upon germanium, and particularly upon n-type semiconductive germanium it is equally applicable to surface alloying upon p-type and intrinsic semi-conductive germanium and also upon silicon. The recrystallized regions of electrodes made according to the instant invention have p-type conductivity. When, therefore, the electrodes are surface alloyed upon n-type semiconductive germanium or silicon, p-n rectifying junctions are formed. When they are surface alloyed upon p-type semiconductors $p^+$-p junctions are formed; and when they are surface alloyed upon intrinsic conductivity material p-i junctions result.

One important feature of the first embodiment of the invention is the achievement of wetting of the semiconductor surface by an electrode material and the subsequent introduction of aluminum into the electrode material. The initial wetting is accomplished by an electrode material substantially free of aluminum. The subsequent introduction of aluminum into the material that has wetted the semiconductor surface may be accomplished in alternative ways other than the specific example heretofore described. For example, an indium or indium-copper electrode pellet may be surface alloyed upon a semiconductor wafer and cooled to room temperature. A small quantity of aluminum or a second pellet comprising an alloy of indium and aluminum may then be supported on top of the surface alloyed pellet and the entire assembly reheated at least to the initial alloying temperature to redissolve the recrystallized region and to permit the aluminum to diffuse throughout the molten combination electrode.

An important feature according to the second embodiment of the instant invention is the limitation of the aluminum proportion in the electrode pellet to at most about 2% and the inclusion of a wetting agent such as copper, silver or gold in the pellet to overcome the wetting inhibitions of the aluminum. The wetting agent may constitute about 0.1% to 10% of the total pellet weight, the precise proportion not being critical. Optimum results, however, and a relatively high degree of reproducibility are achieved when the wetting agent proportion is between 1% and 2%. According to the third embodiment of the invention improved results are accomplished simply by limiting the proportion of aluminum in the indium to a maximum of about 0.5%.

While copper, silver and gold have been heretofore described as substantially equivalent wetting agents in the practice of the invention, copper is the preferred material. Based upon presently available results, copper appears to provide relatively more uniform, consistent and predictable results than do silver and gold.

There have thus been described improved methods of surface alloying aluminum-containing electrodes upon semiconductor surfaces and improved devices made thereby.

What is claimed is:

1. Semiconductor device comprising a semiconductive body of material selected from the group consisting of germanium and silicon and an electrode surface alloyed thereto, said electrode consisting essentially of an alloy of indium with 0.1% to 10% copper, up to 2% aluminum, and including a small proportion of the material of said body.

2. Semiconductor device comprising a semiconductive body of material selected from the group consisting of germanium and silicon and an electrode surface alloyed thereto, said electrode consisting essentially of an alloy of indium, the material of said body, up to 2% aluminum, and at least one substance selected from the group consisting of copper, gold and silver.

3. Semiconductor device comprising a body of semiconductive material selected from the group consisting of germanium and silicon, and an electrode surface alloyed thereto, said electrode consisting essentially of an alloy of indium, the material of said body, up to 2% aluminum, and at least one substance selected from the group consisting of copper, gold and silver.

4. Semiconductor device comprising a semiconductive body of material selected from the group consisting of germanium and silicon and an electrode surface alloyed thereto, said electrode consisting essentially of an alloy of indium, the material of said body, and 0.1% to 0.5% aluminum.

5. Method of making an electrical connection to a semi-conductive body of material selected from the group consisting of germanium and silicon comprising the steps of wetting the surface of said body with molten indium substantially free of aluminum and thereafter introducing aluminum into said indium in a quantity of up to 2 wgt. percent based on the quantity of indium.

6. Method of forming an electrode upon a surface of a semiconductive body of material selected from the group consisting of germanium and silicon, said method comprising the steps of forming a laminar pellet having a layer comprising indium substantially free of aluminum at one surface thereof, said pellet also having a layer consisting essentially of an alloy of indium and up to 2% aluminum, contacting said aluminum-free layer of said pellet to said surface, and heating said pellet and said surface together to a temperature above the melting point of said pellet thereby to surface alloy said pellet to said body.

7. Method of forming an electrode upon a surface of a semiconductive body of material selected from the group consisting of germanium and silicon, said method comprising alloying a laminar pellet upon said surface, said pellet having a layer at one surface thereof consisting essentially of an aluminum-free alloy of indium and at least one substance selected from the group consisting of copper, gold and silver, said pellet also having a layer consisting essentially of an alloy of indium and up to 2% aluminum, said alloying comprising the steps of contacting said aluminum-free layer of said pellet to said surface and heating said pellet and said surface together to a temperature above the melting point of said pellet thereby to surface alloy said pellet to said body.

8. Method of forming an electrode upon a surface of a body of a semiconductive material selected from the group consisting of germanium and silicon, said method comprising alloying a laminar pellet upon said surface, said pellet having two outer layers and an inner layer, said outer layers consisting essentially of an aluminum-free alloy of indium and at least one substance selected from the group consisting of copper, gold and silver, said inner layer consisting essentially of an alloy of indium and up to 2% aluminum, said alloying comprising the steps of contacting one of said outer layers to said surface and heating said pellet and said surface together to a temperature above the melting point of said pellet thereby to surface alloy said pellet to said body.

9. The method according to claim 8 wherein said semiconductive body is of n-type semiconductive germanium.

10. Method of forming an electrode upon a surface of a body of semiconductive material selected from the group consisting of germanium and silicon, said method comprising surface alloying upon said surface an electrode pellet consisting essentially of an alloy of indium with up to 2% aluminum and also including 0.1% to 10% of a substance selected from the group consisting of copper, gold and silver.

11. Method of forming an electrode upon a surface of a body of semiconductive material selected from the group consisting of germanium and silicon, said method comprising surface alloying upon said surface an electrode pellet consisting essentially of an alloy of indium with up to 2% aluminum and also including 0.1% to 10% of copper.

12. Method of forming an electrode upon a surface of a body of semiconductive material selected from the group consisting of germanium and silicon, said method comprising surface alloying upon said surface an electrode pellet consisting essentially of an alloy of indium with about 1% aluminum and 1% to 2% copper.

13. Method of forming an electrode upon a surface of a body of semiconductive material selected from the group consisting of germanium and silicon, said method comprising surface alloying upon said surface an electrode pellet consisting essentially of an alloy of indium and about 0.1% to 0.5% aluminum.

References Cited in the file of this patent

UNITED STATES PATENTS

| | | |
|---|---|---|
| 2,703,855 | Koch et al. | Mar. 8, 1955 |
| 2,725,315 | Fuller | Nov. 29, 1955 |
| 2,781,481 | Armstrong | Feb. 12, 1957 |

OTHER REFERENCES

Armstrong: Proceedings of the I. R. E., No. 11, vol. 40, pages 1341, 1342, November 1952.